(12) United States Patent
Lien et al.

(10) Patent No.: US 11,972,803 B2
(45) Date of Patent: Apr. 30, 2024

(54) WORD LINE ZONE DEPENDENT PRE-CHARGE VOLTAGE

(71) Applicant: SanDisk Technologies LLC, Addison, TX (US)

(72) Inventors: Yu-Chung Lien, San Jose, CA (US); Fanqi Wu, Milpitas, CA (US); Jiahui Yuan, Fremont, CA (US)

(73) Assignee: SanDisk Technologies, LLC, Addison, TX (US)

( * ) Notice: Subject to any disclaimer, the term of this patent is extended or adjusted under 35 U.S.C. 154(b) by 176 days.

(21) Appl. No.: 17/571,124

(22) Filed: Jan. 7, 2022

(65) Prior Publication Data

US 2023/0223084 A1    Jul. 13, 2023

(51) Int. Cl.
| | |
|---|---|
| *G11C 11/34* | (2006.01) |
| *G11C 7/10* | (2006.01) |
| *G11C 16/08* | (2006.01) |
| *G11C 16/10* | (2006.01) |
| *G11C 16/26* | (2006.01) |
| *G11C 16/30* | (2006.01) |

(52) U.S. Cl.
CPC .......... *G11C 16/102* (2013.01); *G11C 7/1048* (2013.01); *G11C 16/08* (2013.01); *G11C 16/26* (2013.01); *G11C 16/30* (2013.01)

(58) Field of Classification Search
CPC ......... G11C 7/12; G11C 7/22; G11C 11/4094; G11C 7/1048; G11C 7/4091
USPC .............................................. 365/185.15, 203
See application file for complete search history.

(56) References Cited

U.S. PATENT DOCUMENTS

| | | | |
|---|---|---|---|
| 9,620,198 B1* | 4/2017 | Nam ........................ | G11C 8/14 |
| 2015/0155040 A1* | 6/2015 | Shim ...................... | G11C 16/10 |
| | | | 365/185.25 |
| 2021/0090651 A1* | 3/2021 | Kim .................... | G11C 13/0033 |

* cited by examiner

*Primary Examiner* — Son T Dinh
(74) *Attorney, Agent, or Firm* — Dickinson Wright PLLC; Steven C. Hurles

(57) ABSTRACT

A memory device that uses different programming parameters base on the word line(s) to be programmed is described. The programming parameter PROGSRC_PCH provides a pre-charge voltage to physical word lines. In some instances, the PROGSRC_PCH voltage is decoupled, and a new PROGSRC_PCH represents an adjusted (e.g., increased) pre-charge voltage for a certain physical word line or word line zone (i.e., predetermined group of word lines). Using different PROGSRC_PCH voltages can limit or prevent Vt distribution window degradation, particularly for relatively low physical word lines. Additionally, the overall programming time and average current consumed can also be reduced.

14 Claims, 17 Drawing Sheets

US 11,972,803 B2

WORD LINE ZONE DEPENDENT PRE-CHARGE VOLTAGE

TECHNICAL FIELD

This application is directed to using a different voltage, including pre-charge voltage, based on the word line or word line zone prior to programming. By adjusting the pre-charge voltage based on word line zone dependence, the Vt window is enhanced/improved as issues (e.g., erase upper tail) are mitigated.

BACKGROUND

For NAND flash memory with n bits per memory cell, the threshold voltage ("Vt") of a memory cell can be programmed to $2^n$ separate data states including an erased data state and $2^n-1$ programmed data states. For example, a triple-living cell ("TLC") has eight separate data states (the erased data state and seven programmed data states), each represented by a predetermined Vt distribution. The gap, or space, between an upper tail of the erased data state and a lower tail of a final programmed data state defines a Vt distribution window. After programming, the Vt distribution window of an array of memory cells can degrade for various reasons, including changes to an upper tail or the overall curvature of a Vt distribution. In certain NAND technologies, this is evident in lower physical word lines of strings that contain a large number of word lines. For example, one type of stack includes approximately one hundred and sixty word lines (WL0-WL160), and the threshold voltages of the erased data states of physical word lines WL0-WL20 may have an increased/elevated upper tails, thus causing degradation.

SUMMARY

According to an aspect of the present disclosure is related to a method for accessing a block of a memory device. The method includes decoupling a programming parameter to form a first pre-charge voltage and a second pre-charge voltage different from the first pre-charge voltage. The method includes selecting a word line. The method includes when the word line is within a predetermined word line zone, applying the first pre-charge voltage. The method includes when the word line is outside the predetermined word line zone, applying the second pre-charge voltage.

In an embodiment, the first pre-charge voltage includes a first CELSRC voltage, and the second pre-charge voltage includes a second CELSRC that is less than the first CELSRC voltage.

In an embodiment, the method includes applying a programming voltage to the word line, wherein the programming voltage is less than the first CELSRC voltage.

In an embodiment, the predetermined word line zone is a first predetermined word line zone, and the method further includes decoupling the programming parameter to form a third pre-charge voltage different from the first pre-charge voltage and the second pre-charge voltage. The method includes when the word line is within a second predetermined word line zone, applying the third pre-charge voltage.

In an embodiment, the first predetermined word line zone includes physical word lines WL0-WL20.

In an embodiment, the second predetermined word line zone includes at least one physical word line that is greater than the physical word line WL20.

In an embodiment, the method includes applying a bit line pre-charge voltage while applying the first pre-charge voltage.

According to another aspect of the disclosure, a memory system includes a memory device. The memory system further includes a controller operatively coupled to the memory device. The controller is configured to decouple a program parameter to form a first pre-charge voltage and a second pre-charge voltage different from the first pre-charge voltage. The controller is configured to select a word line. The controller is configured to when the word line is within a predetermined word line zone, apply the first pre-charge voltage. The controller is configured to when the word line is outside the predetermined word line zone, apply the second pre-charge voltage.

In an embodiment, the first pre-charge voltage includes a first CELSRC voltage, and the second pre-charge voltage includes a second CELSRC that is less than the first CELSRC voltage.

In an embodiment, the controller is configured to apply a programming voltage to the word line, wherein the programming voltage is less than the first CELSRC voltage.

In an embodiment, the predetermined word line zone is a first predetermined word line zone, and the controller is configured to decouple the programming parameter to form a third pre-charge voltage different from the first pre-charge voltage and the second pre-charge voltage. The controller is configured to when the word line is within a second predetermined word line zone, apply the third pre-charge voltage.

In an embodiment, the first predetermined word line zone includes physical word lines WL0-WL20.

In an embodiment, the second predetermined word line zone includes at least one physical word line that is greater than the physical word line WL20.

In an embodiment, the controller is configured to apply a bit line pre-charge voltage while apply the first pre-charge voltage.

According to another aspect of the disclosure, a non-transitory computer readable storage medium configured to store instructions that, when executed by a processor included a controller of a memory system, cause the memory system to carry out steps to decouple a program parameter to form a first pre-charge voltage and a second pre-charge voltage different from the first pre-charge voltage. The controller is configured to select a word line. The controller is configured to when the word line is within a predetermined word line zone, apply the first pre-charge voltage. The controller is configured to when the word line is outside the predetermined word line zone, apply the second pre-charge voltage.

In an embodiment, the first pre-charge voltage includes a first CELSRC voltage, and the second pre-charge voltage includes a second CELSRC that is less than the first CELSRC voltage.

In an embodiment, the controller is configured to apply a programming voltage to the word line, wherein the programming voltage is less than the first CELSRC voltage.

In an embodiment, the predetermined word line zone is a first predetermined word line zone, and the controller is configured to decouple the programming parameter to form a third pre-charge voltage different from the first pre-charge voltage and the second pre-charge voltage. The controller is configured to when the word line is within a second predetermined word line zone, apply the third pre-charge voltage.

In an embodiment, the first predetermined word line zone includes physical word lines WL0-WL20.

In an embodiment, the second predetermined word line zone includes at least one physical word line that is greater than the physical word line WL20.

In an embodiment, the controller is configured to apply a bit line pre-charge voltage while apply the first pre-charge voltage.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1A:
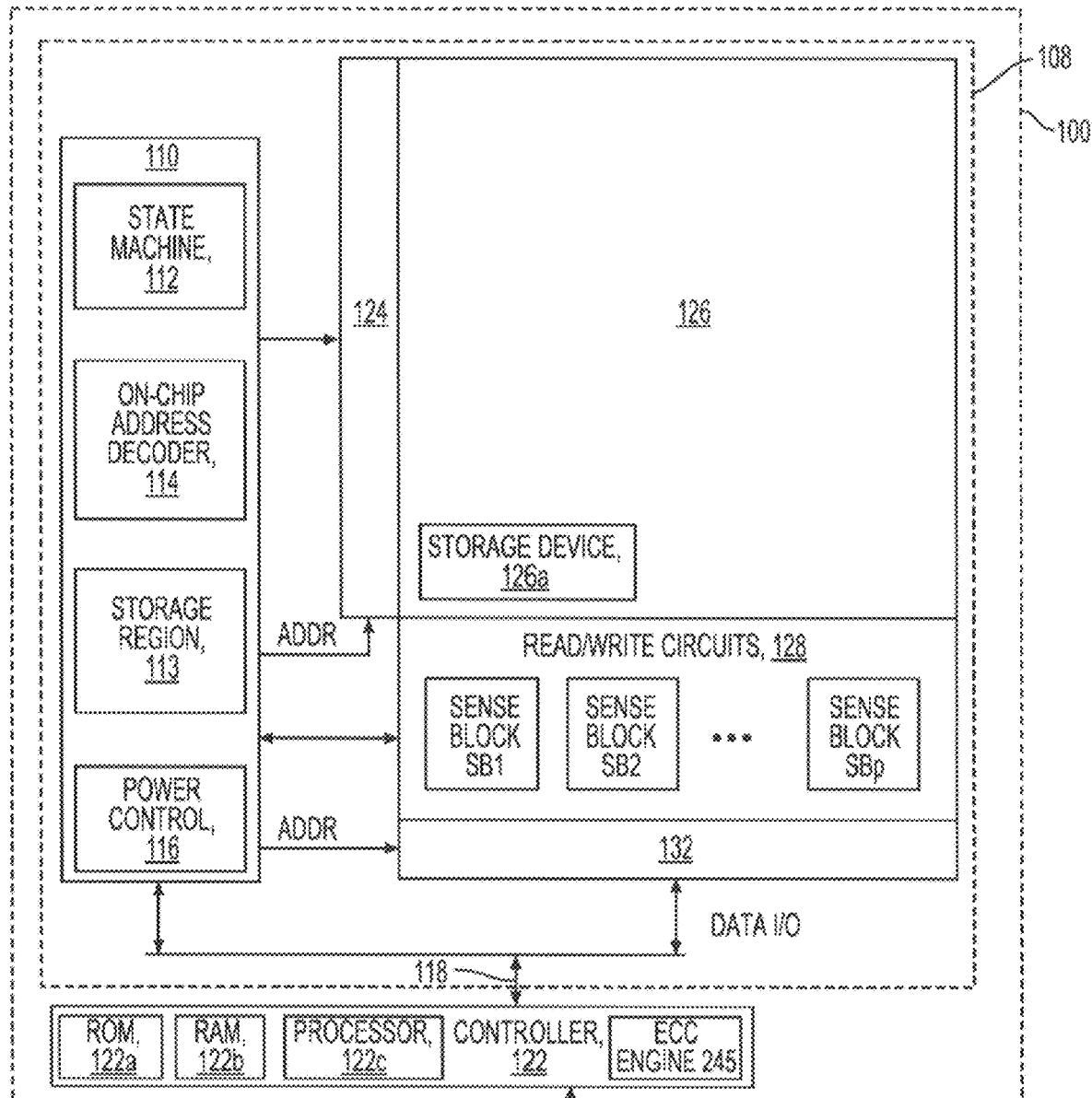
FIG. 1A is a block diagram of an example memory device.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The following disclosure is related to providing different pre-charge voltages in order to provide enhancements and/or corrections to a Vt distribution window based on word line location within a stack. Traditional memory system use a programming parameter PROGSRC_PCH to provide a pre-charge voltage during a programming operation. Using a single PROGSRC_PCH can cause Vt window degradation, particularly at relatively lower physical word lines. For instance, the erase upper tail of the Vt window can increase at the lower physical word lines.

In the following described embodiments, PROGSRC_PCH can be decoupled into multiple, different PROGSRC_PCH, with each PROGSRC_PCH assigned to a word line(s) being programmed. For example, for a physical word line ("WL") of 20 or less (WL0-WL20), the PROGSRC_PCH pre-charge voltage can be increased by a delta PROGSRC_PCH, or DPROGSRC_PCH, as compared to the other WL's. Several WL's, including physical WL 20, can form a WL zone, which can be pre-charged by a particular PROGSRC_PCH. Moreover, in some embodiments, several WL zones can be defined, and each WL zone may use its own particular, predetermined PROGSRC_PCH.

In additional to enhancing the Vt window, a WL zone dependent PROGSRC_PCH can provide additional benefits. For example, the overall programming time ("Tprog") can be reduced for a program-verify operation. Additionally, the average current consumed ("ave Icc") can also be reduced.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

Figure 1B:
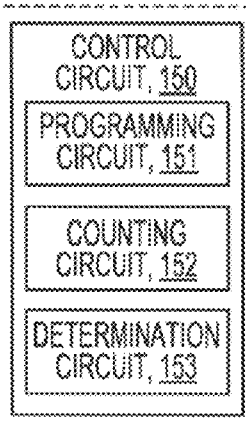
FIG. 1B is a block diagram of an example control circuit that includes a programming circuit, a counting circuit, and a determination circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high or the lower tail of a Vth distribution becomes too low. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
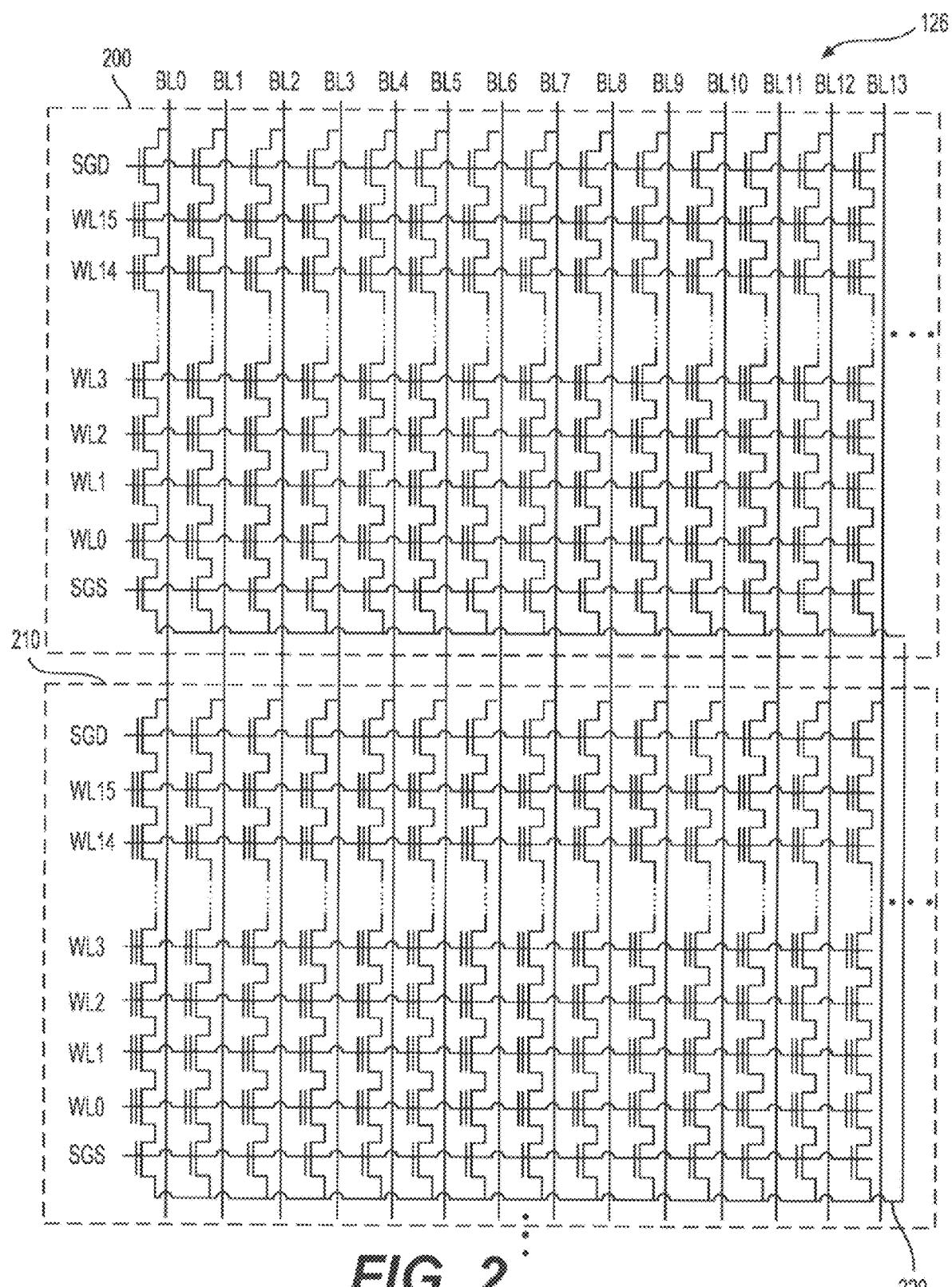
FIG. 2 illustrates schematic views of three types of memory architectures utilizing staggered memory strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, ... which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
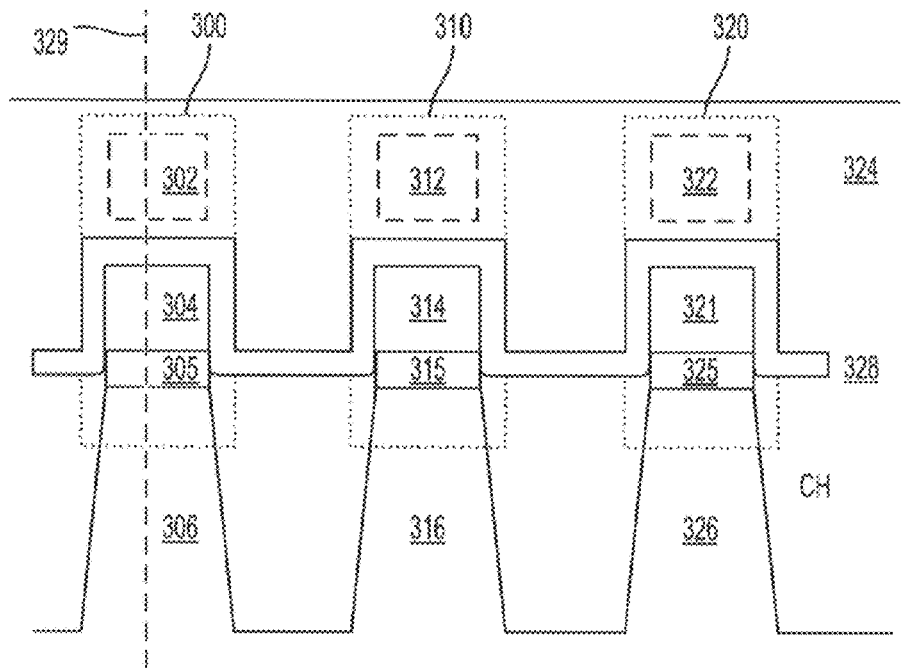
FIG. 3A illustrates a cross-sectional view of example floating gate memory cells in NAND strings.
Figure 3B:
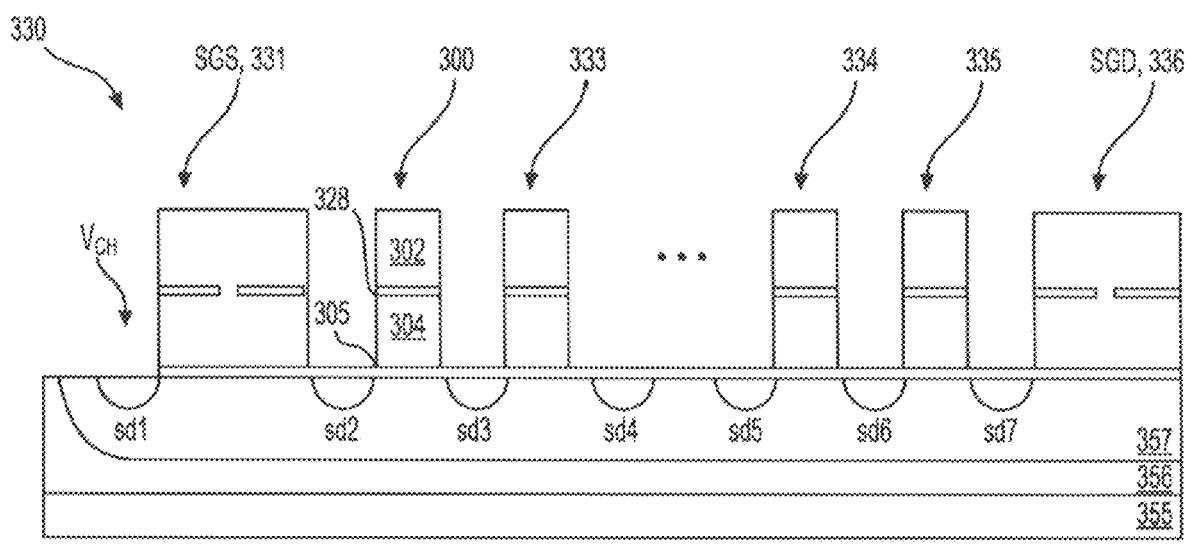
FIG. 3B illustrates a cross-sectional view along a contact line shown in FIG. 3A.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
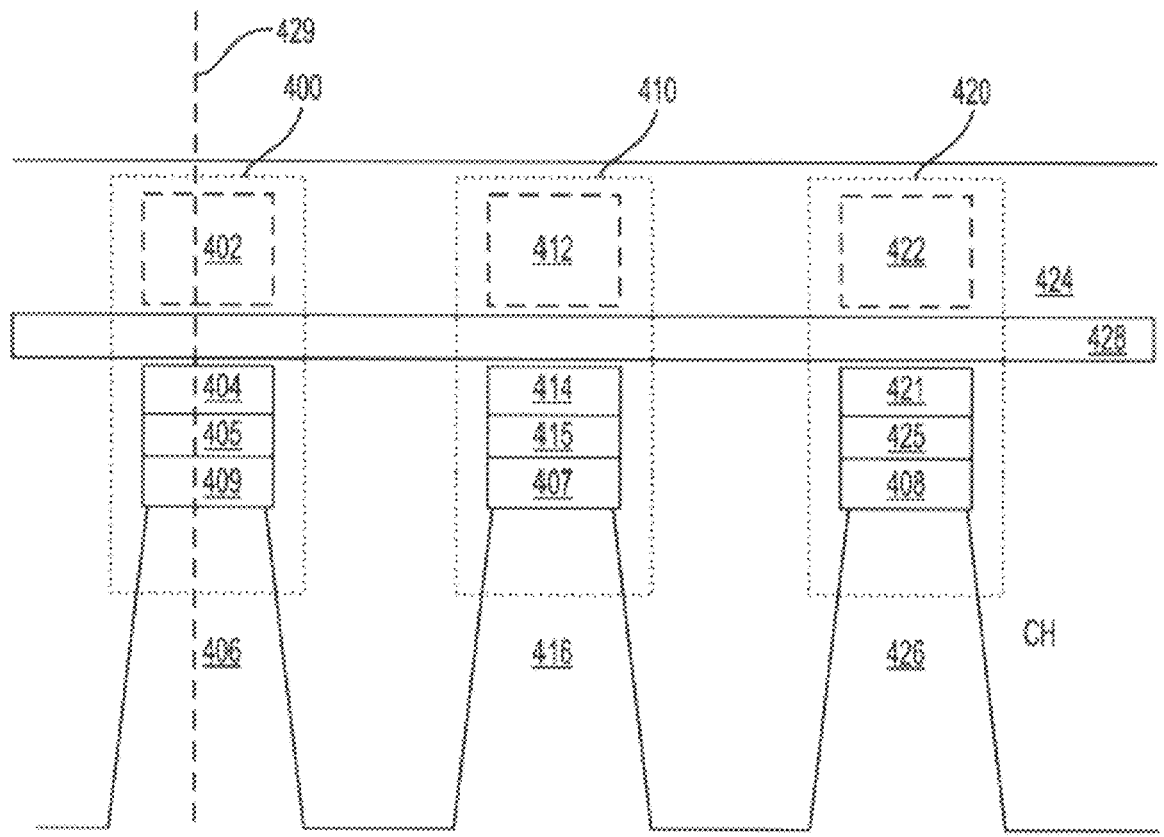
FIGS. 4A and 4B illustrate non-volatile memory in which a charge-trapping memory cell uses a non-conductive dielectric material in place of a conductive floating gate to store charge in a non-volatile manner.
Figure 4B:
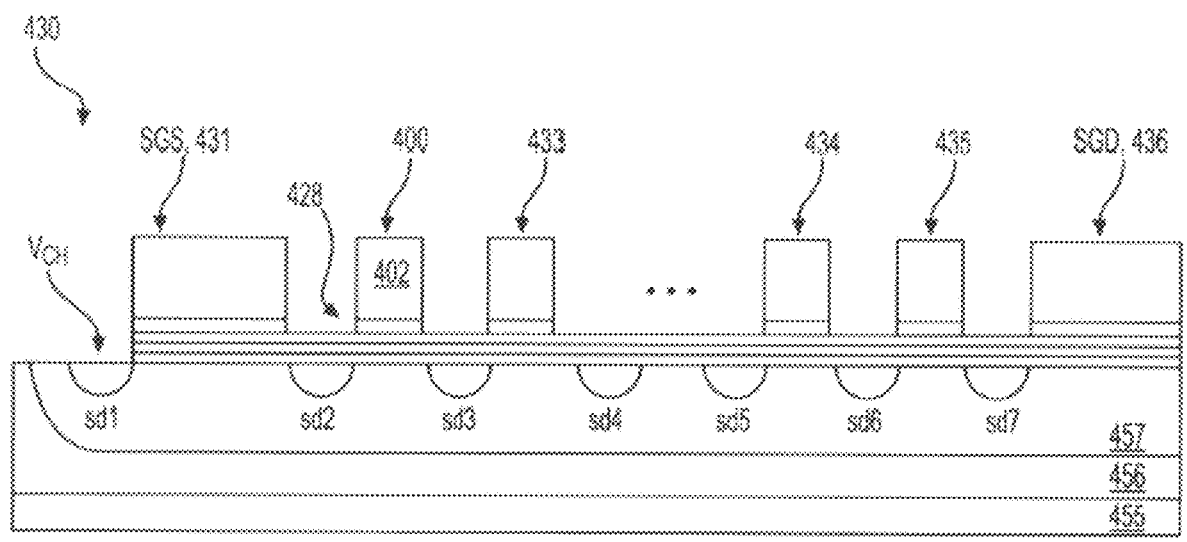

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
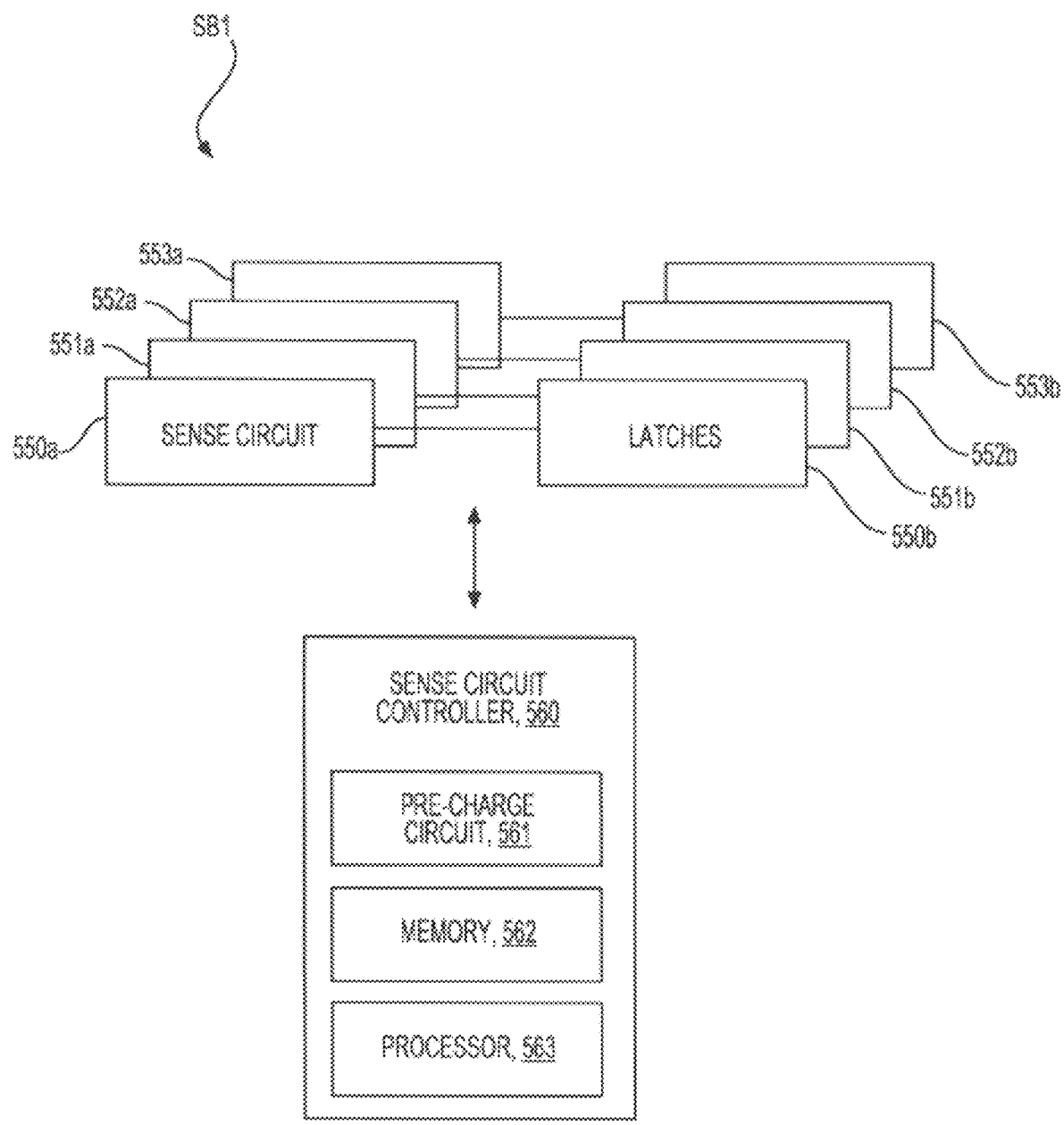
FIG. 5 illustrates an example block diagram of the sense block of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
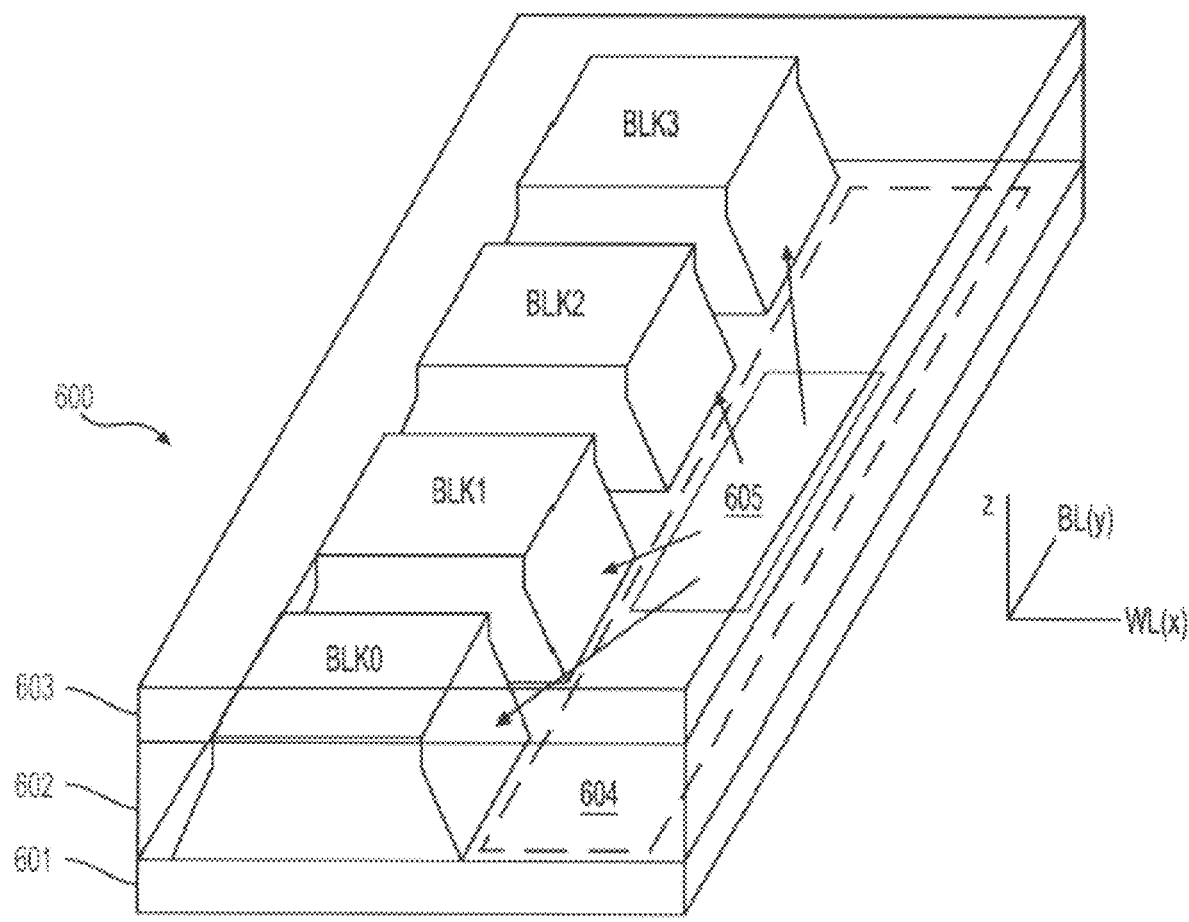
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
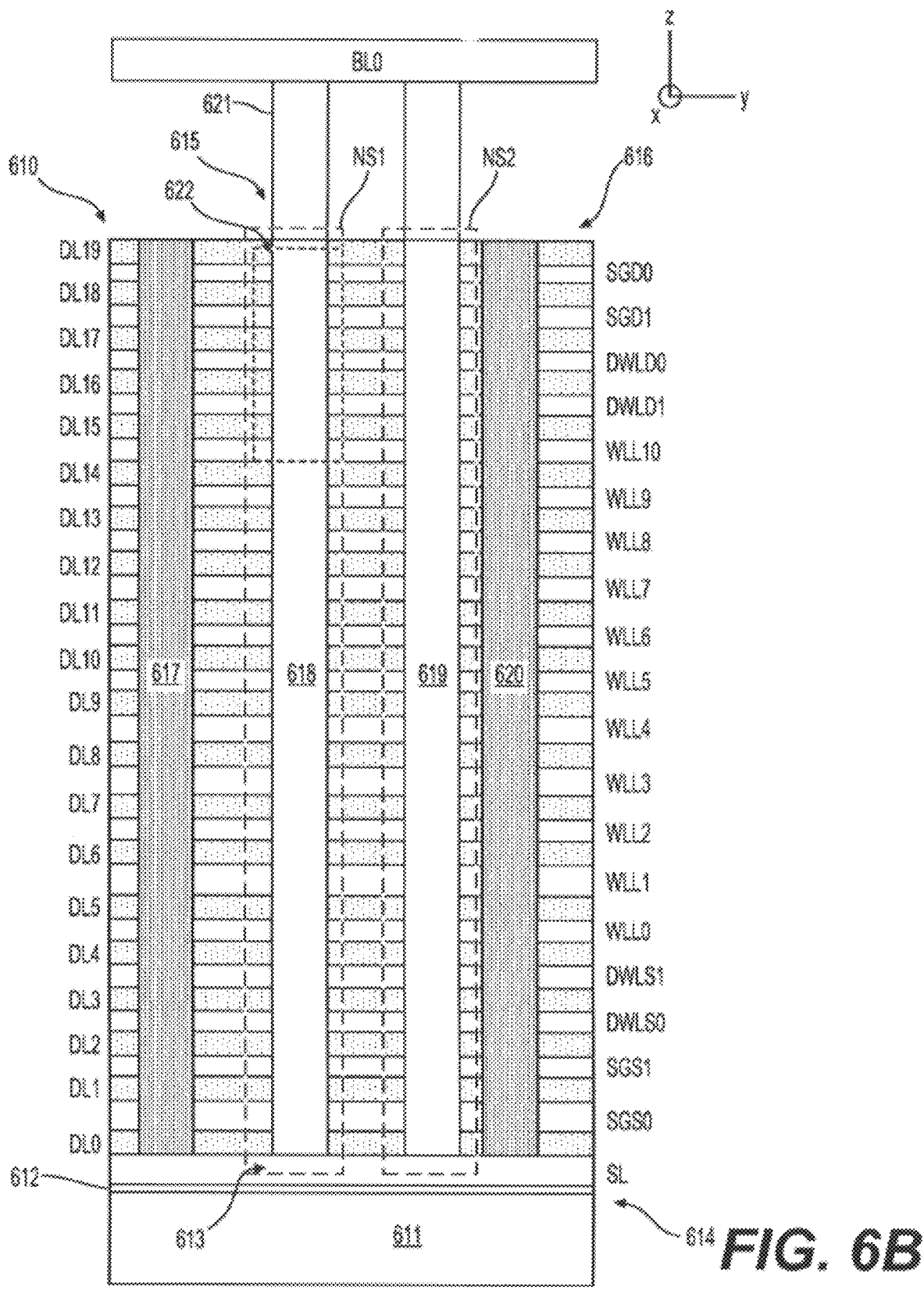
FIG. 6B illustrates an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
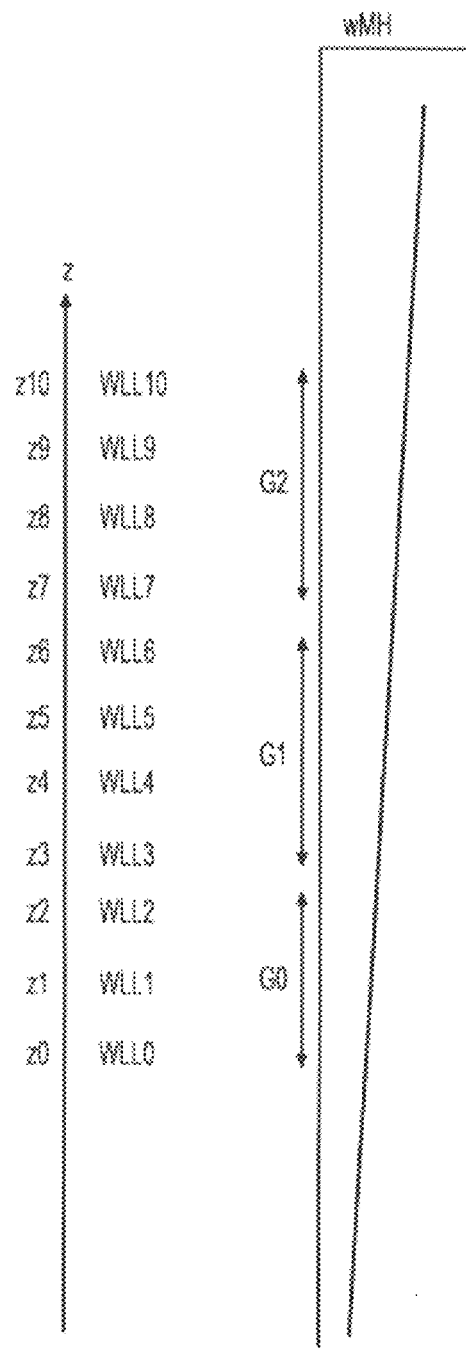
FIG. 6C illustrates a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
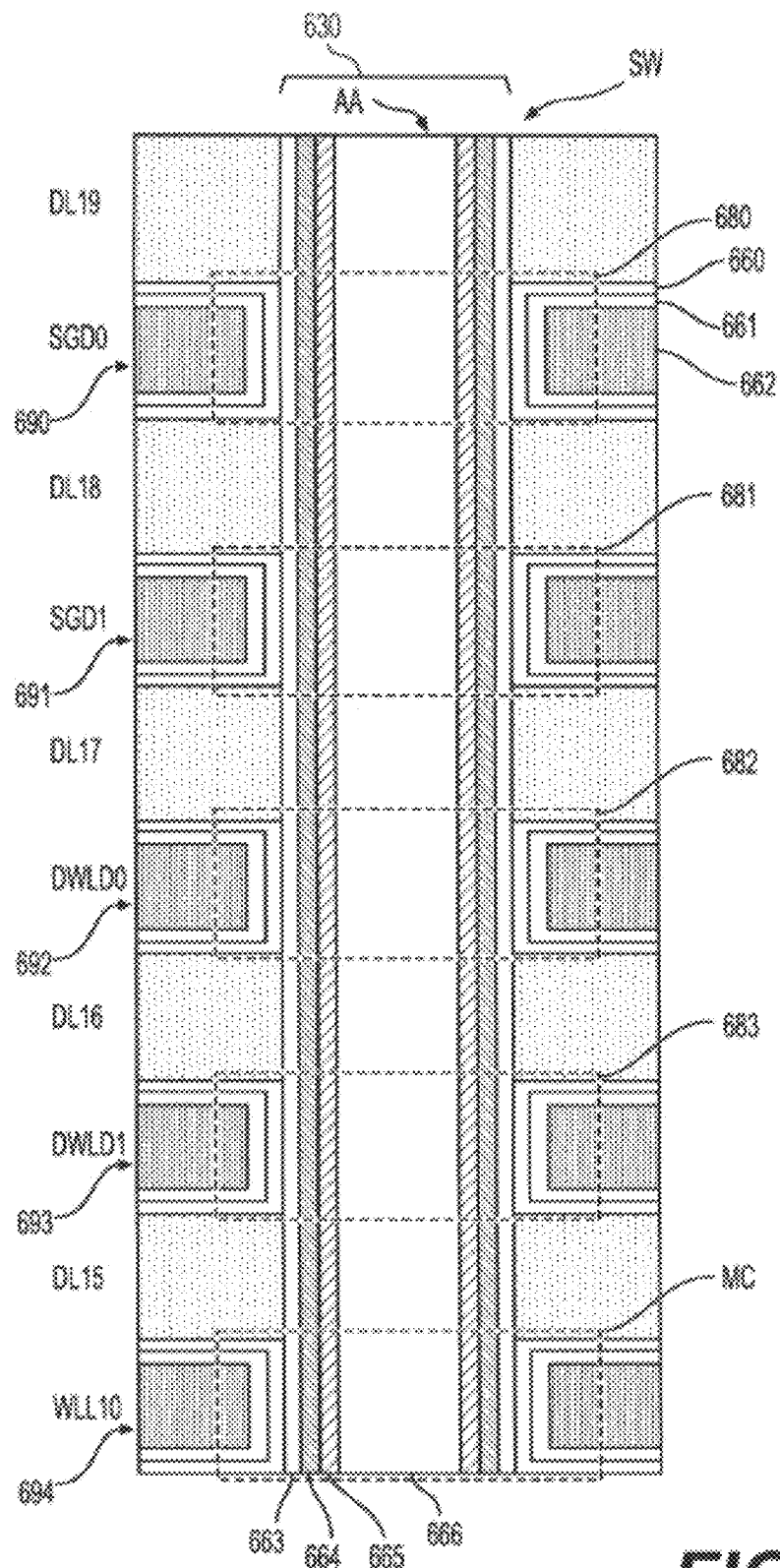
FIG. 6D illustrates a close-up view of the region of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

The memory systems discussed herein can be erased, programmed and read. At the end of a successful programming process (with verification), the threshold voltages of the memory cells should be within one or more distributions (ranges) of threshold voltages for programmed memory cells or within a distribution (range) of threshold voltages for erased memory cells, as appropriate. At the end of a successful programming process (with verification), the threshold voltages of the memory cells should be within one or more distributions of threshold voltages for programmed memory cells or within a distribution of threshold voltages for erased memory cells, as appropriate.

Figure 7A:
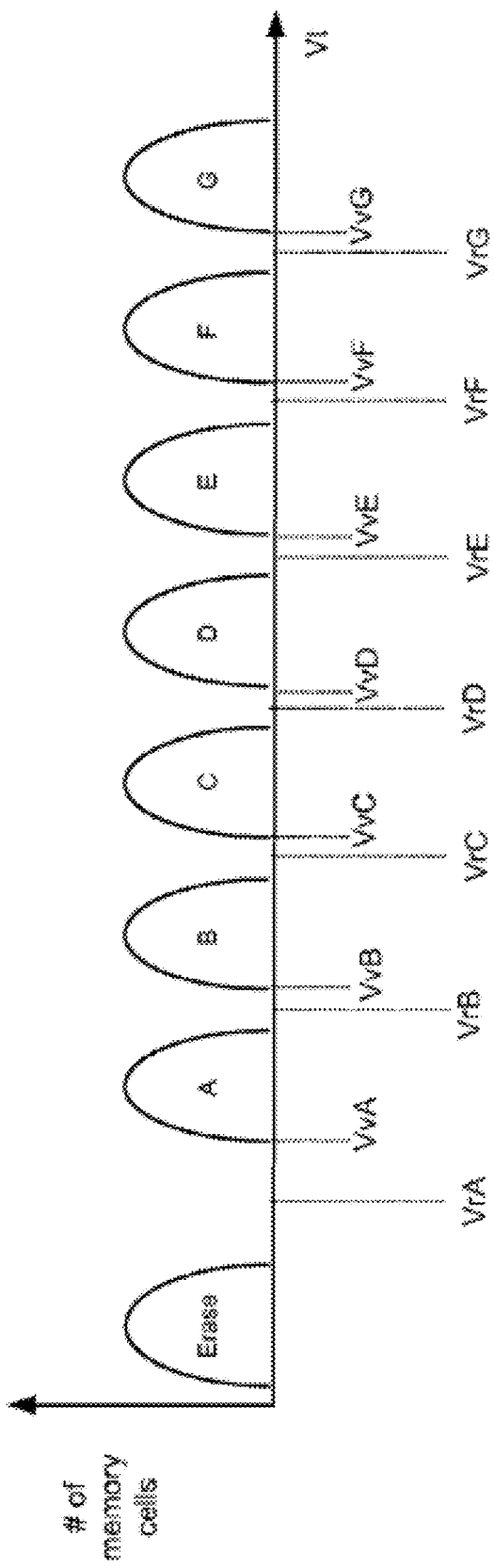
FIG. 7A illustrates a threshold voltage distributions for states of memory cells.

FIG. 7A depicts example threshold voltage distributions for states of memory cells. As shown, the memory cells represent are eight states. The eight data states include an erase state and states A-G. In this example, this example depicts TLC memory cells, i.e., three bits of data are stored per memory cell. Between each of the data states are read reference voltages used for reading data from memory cells. For example, FIG. 7A shows read reference voltage VrA between data states erase and A, and VrB between data states A and B. By testing whether the threshold voltage of a given memory cell is above or below the respective read reference voltages, the system can determine what data state the memory cell is in. At or near the lower edge of each data state are verify reference voltages. For example, FIG. 7A shows VvA for state A and VvB for state B, etc. When programming memory cells to a given state, the system will test whether those memory cells have a threshold voltage greater than or equal to the verify reference voltage.

Figure 7B:
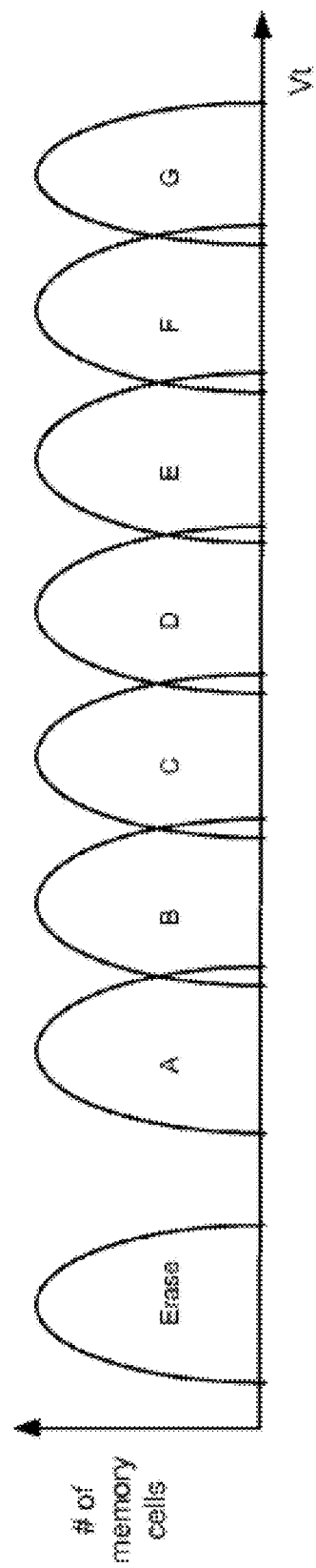
FIG. 7B depicts example threshold voltage distributions in which there is overlap.

In some embodiments, there may be some overlap between threshold voltage distributions. FIG. 7B depicts one such example when three bits are stored per memory cell. Note that this distribution may occur immediately after programming. An ECC algorithm conducted by the aforementioned ECC engine can be used to correct misreads, providing there are not too many. The verify and read levels are just one example. Other verify and read levels may be used.

Although the programming examples depict eight data states and three pages of data, the concepts taught can be applied to other implementations with more or fewer than eight states and more or fewer than three pages. Moreover, in the example programming techniques discussed, the Vt of a memory cell is raised gradually as it is programmed to a target data state.

Figure 8:
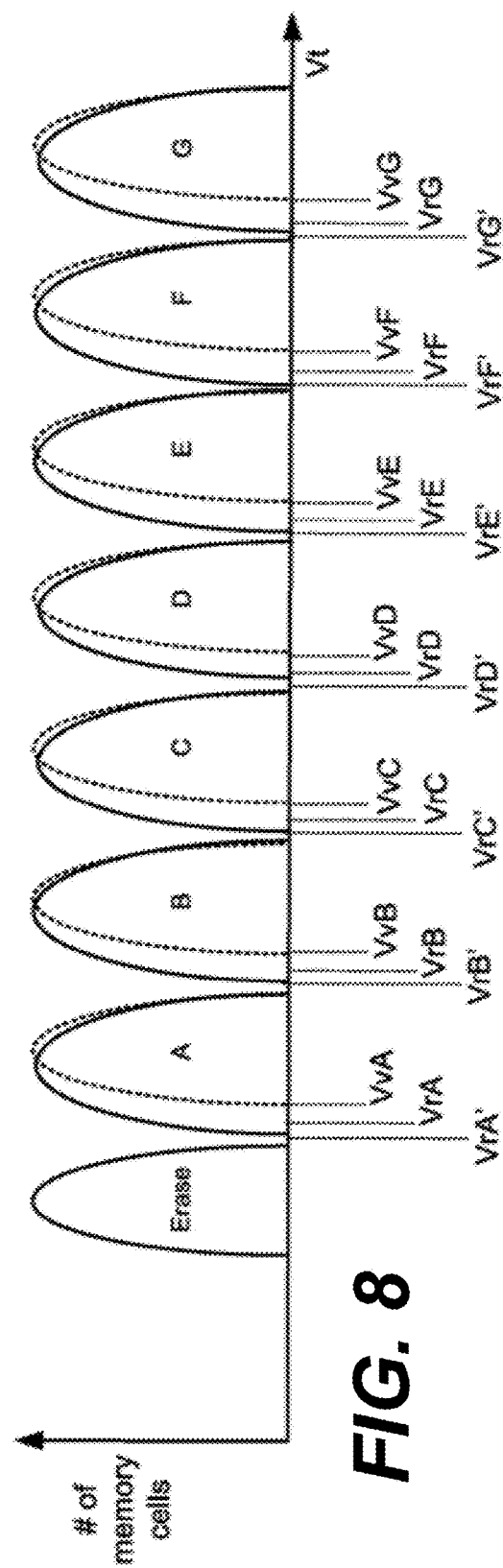
FIG. 8 shows Vt distributions illustrating charge loss for memory cells in the A-state through the G-state.

FIG. 8 shows Vt distributions illustrating charge loss for memory cells in the A-state through the G-state. The dashed Vt distributions represent the Vt distributions for the A-state through the G-state immediately after programming. The solid lines represent the shift to the Vt distributions for the A-state through the G-state. In this example, the shift lowers the Vt distributions for the A-state through the G-state. In this example, the lower tail is shifted downward (e.g., has a lower Vt). However, the upper tail remains about the same, in this example.

Note that some of the memory cells in the shifted distributions in FIG. 8 have a Vt that is below the read reference level for their Vt distribution. For example, a small portion of the Vt distribution for the A-state is below VrA. This will result in some A-state memory cells being read as being in the erased state, which is referred to as a fail bit. Similar analysis applies to other data states. An ECC engine (referenced above) is able to correct errors and successfully read the data, providing that the fail bit count is not too high. However, the time it takes to read may be substantially increased. In some applications, a large amount of data is pre-loaded into the memory system. Moreover, this pre-loaded data may be stored at multiple bits per memory cell to provide for a large amount of pre-loaded data. Embodiments of memory system are able to efficiently and accurately read the pre-loaded data following a heating event such as an IR reflow.

In some embodiments, the memory device determines new read reference levels, which reduces the fail bit count. Determining new read reference levels is also referred to as calibrating the read reference levels. FIG. 8 shows read reference voltages VrA', VrB', VrC', VrD', VrE', VrF', and VrG'. These are newly determined voltages for reading the memory cells instead of the former read reference voltages VrA, VrB, VrC, VrD, VrE, VrF, and VrG. Note that VrA', VrB', VrC', VrD', VrE', VrF', and VrG' will have lower fail bit counts for the shifted distributions than if VrA, VrB, VrC, VrD, VrE, VrF, and VrG were used. In some embodiments, the memory device 100 determines the new read reference levels after a heating event such as an IR reflow. One challenge in determining the new read reference levels is that the IR reflow (or other heating event) typically causes a substantial charge loss, and hence a substantial shift in the threshold voltage distributions. Moreover, determining the new read reference levels after a heating event can be challenging due to instability of one or more conditions in the memory structure 126. As will be discussed in more detail below, memory cell threshold voltages may be unstable, which can make it very challenging to properly calibrate the new read threshold voltages. Embodiments of a memory system stabilize one or more conditions of a memory structure after a heating event, prior to determining new read reference levels. In one embodiment, the memory system stabilizes the threshold voltages of the memory cells. In one embodiment, the memory system stabilizes voltages of word lines connected to the memory cells. In one embodiment, the memory system performs a dummy read to stabilize one or more conditions in the memory structure. Thus, the memory system is able to accurately determine the new read reference levels.

Figure 9:
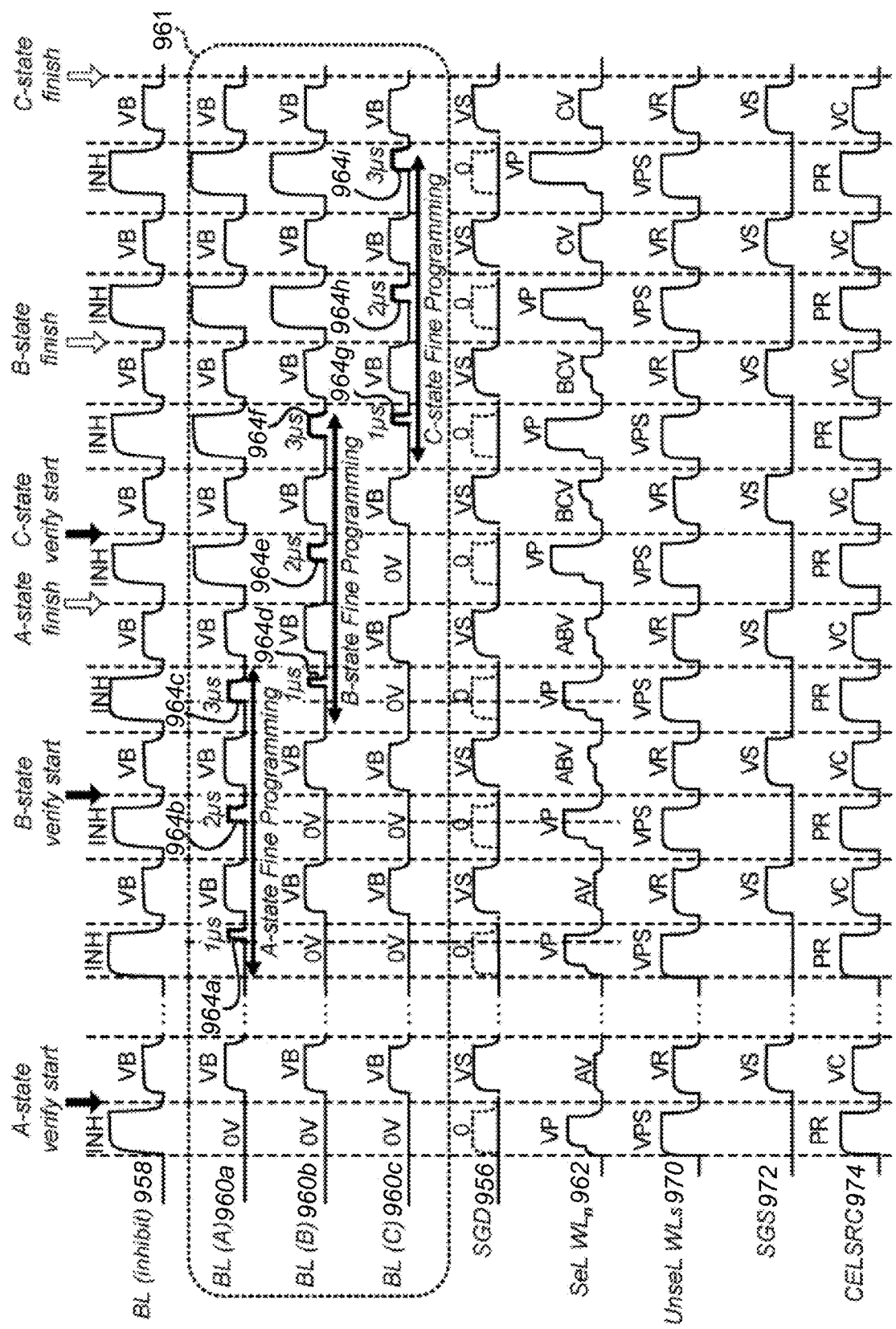
FIG. 9 illustrates a timing diagram illustrating an example of increasing a bit line voltage during program pulses for multiple states.

FIG. 9 illustrates a timing diagram illustrating an example of increasing a bit line voltage during program pulses for multiple states. The timing diagram includes a drain select gate (SGD) voltage 956, an inhibit bit line (BL) voltage 958, an A-state program bit line (BL (A)) voltage 960a, a B-state program bit line (BL (B)) voltage 960b, a C-state program bit line (BL (C)) voltage 960c, a selected word line (SeL WLn) voltage 962, unselected word line (UnseL WLs) voltages 970, a source select gate (SGS) voltage 972, and a cell source voltage (CELSRC) 974 over time. In an embodiment, a programming circuit delivers program pulses (VP) to the selected word line, a sensing circuit delivers verify pulses (AV, ABV, BCV, CV) to the selected word line, and a damping circuit delivers damping pulses to the bit line(s) being programmed. The verify pulses may be at one or more different levels to verify different states. For example, a verify pulse AV is used to verify an A state, a verify pulse ABV is used to verify A and B states, a verify pulse BCV is used to verify B and C states, and a verify pulse CV is used to verify a C state. In an embodiment, a pass circuit delivers pass pulses (VPS or VPASS) and/or read pulses (VR or VREAD) to unselected word lines. For example, the unselected word line voltages 970 include pass pulses coincident with (e.g., concurrent with) program pulses (VP) on the selected word line, and/or include read pulses coincident with (e.g., concurrent with) verify pulses (AV, ABV, BCV, CV) on the selected word line. In an embodiment, PROG-SRC (PR) and VCELSRC (VC) pulses are delivered in the CELSRC voltage 974. The CELSRC voltage 974 is a source line voltage. A source line voltage may be not biased (at 0V) or may have some voltage higher than 0 V. In the example illustrated in FIG. 9, the CELSRC voltage 974 may be a voltage during programming referred to as PROGSRC (e.g., approximately 2 V). During sensing (e.g., read or verify), the CELSRC voltage 974 may be referred to as VCELSRC (e.g., approximately 1 V). For one or more storage elements (e.g., memory cells) that are not being programmed, the inhibit bit line voltage 958 inhibits programming during inhibit (INH) pulses. For one or more storage elements (e.g., memory cells) being programmed, the program bit line voltages 960a-c are held low (0 V) to allow a charge to accumulate on the floating gate during a program pulse (VP, sometimes also referred to as Vpgm) on a selected word line. In this example, the memory cells are being programmed 961 to particular states (referred to as "A-state," "B-state," and "C-state") as indicated by the bit line voltages 960a-c.

As illustrated in FIG. 9, program bit line voltages 960a-c are held low (0 V) and an inhibit bit line voltage 958 is raised while the selected word line voltage 962 includes a program pulse (VP). In an embodiment, a number of program pulses (VP) may be delivered on a selected word line before verify pulses (Verify) are delivered to the selected word line for a particular state. Bit line pulses (VB) are delivered in the inhibit bit line voltage 958 and the program bit line voltages 760a-c coincident with the verify pulses (AV, ABV, BCV, CV).

Figure 10A:
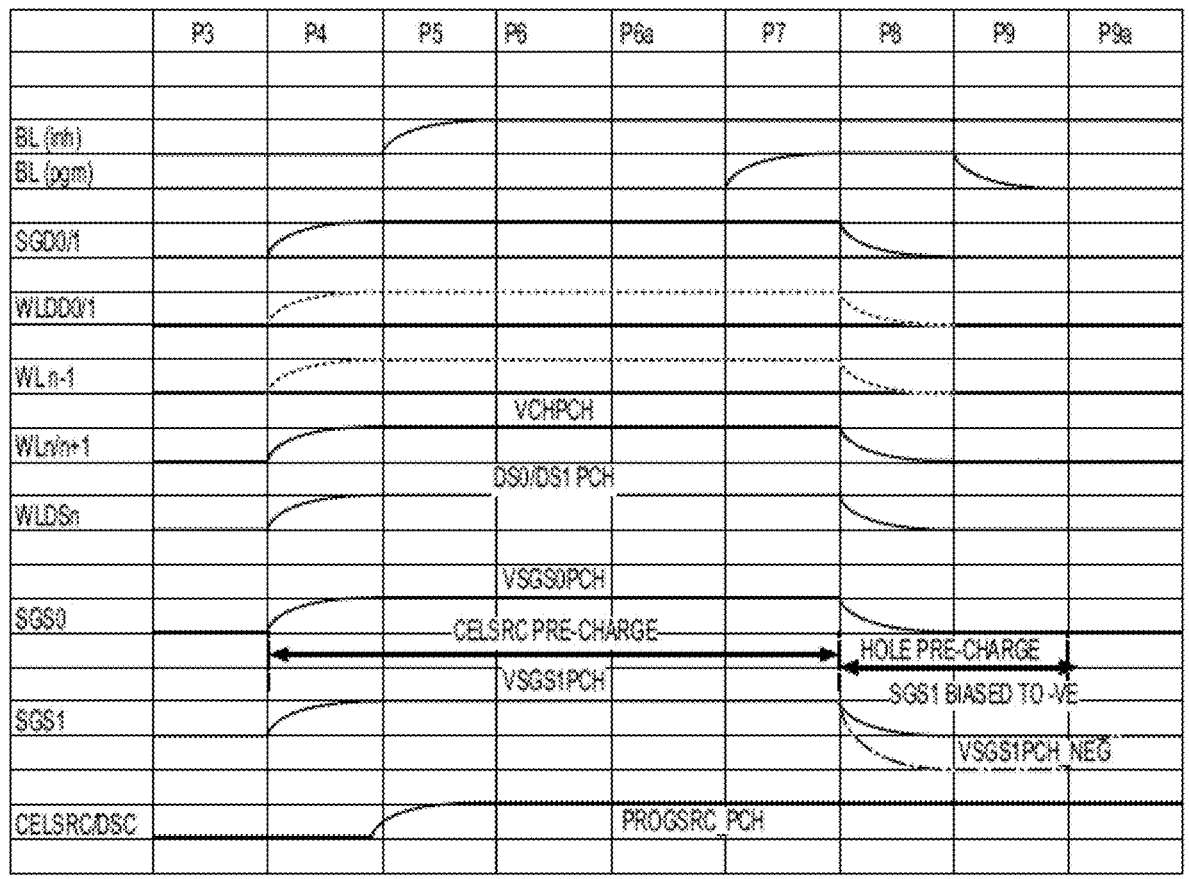
FIGS. 10A and 10B illustrate are signal timing diagrams for example implementations of the hole pre-charge schemes.
Figure 10B:
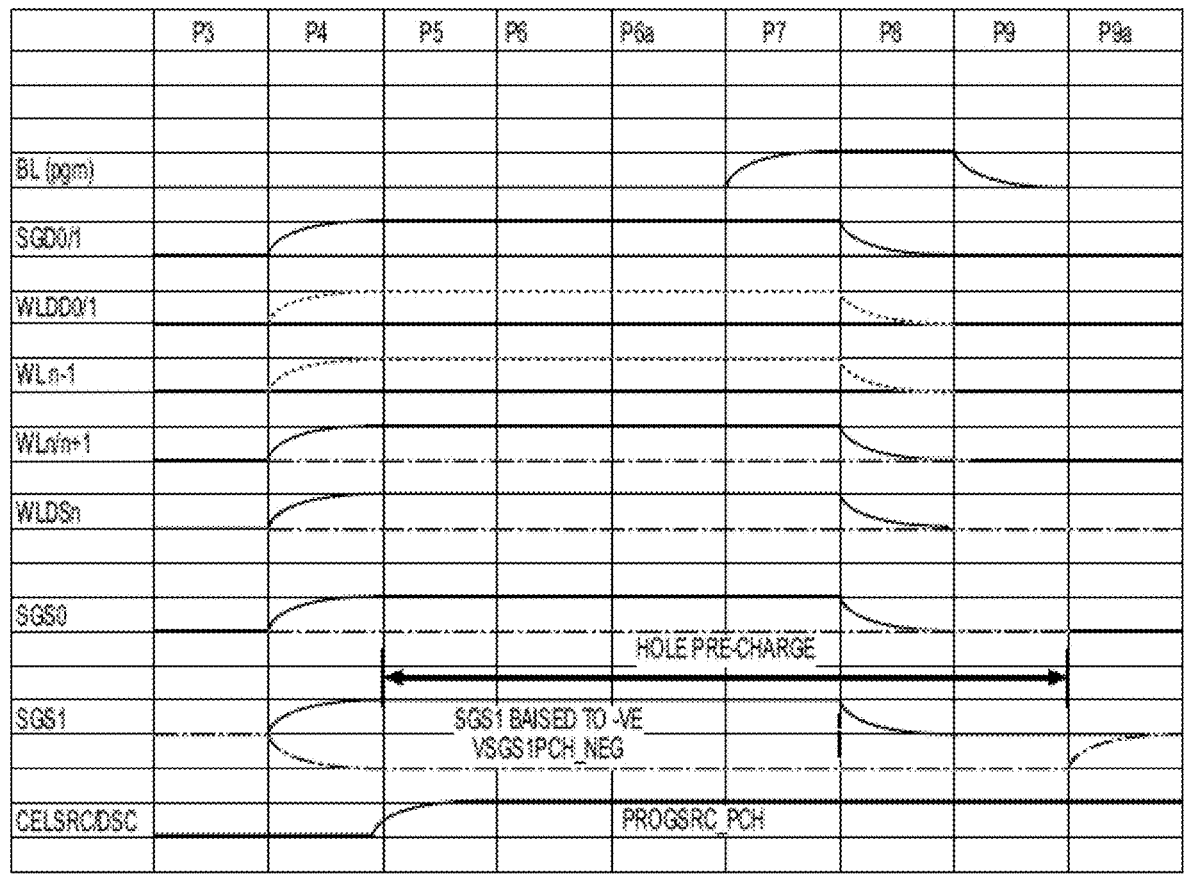

FIGS. 10A and 10B illustrate are signal timing diagrams for example implementations of memory hole pre-charge schemes. For example, FIG. 10A shows hole pre-charge (also referred to as "SGS1 GIDL") following a conventional CELSRC pre-charge. As shown in FIG. 10A, CELSRC pre-charge occurs from clock times P5 to P7 and hole pre-charge occurs from clock times P8 to P9 (by biasing the gate of SGS1 to −Ve). For example, hole pre-charge occurs after CELSRC pre-charging by turning the select line connected to the gate of select transistor SGS1 to a negative bias. In contrast, in FIG. 10B, CELSRC pre-charge does not occur and memory hole pre-charge occurs from clock times P4 to P9 (by biasing the gate of SGS1 to −Ve). In this particular embodiment, a longer time is provided for generating hole GIDL current, thereby improving the boosting potential.

Figure 11:
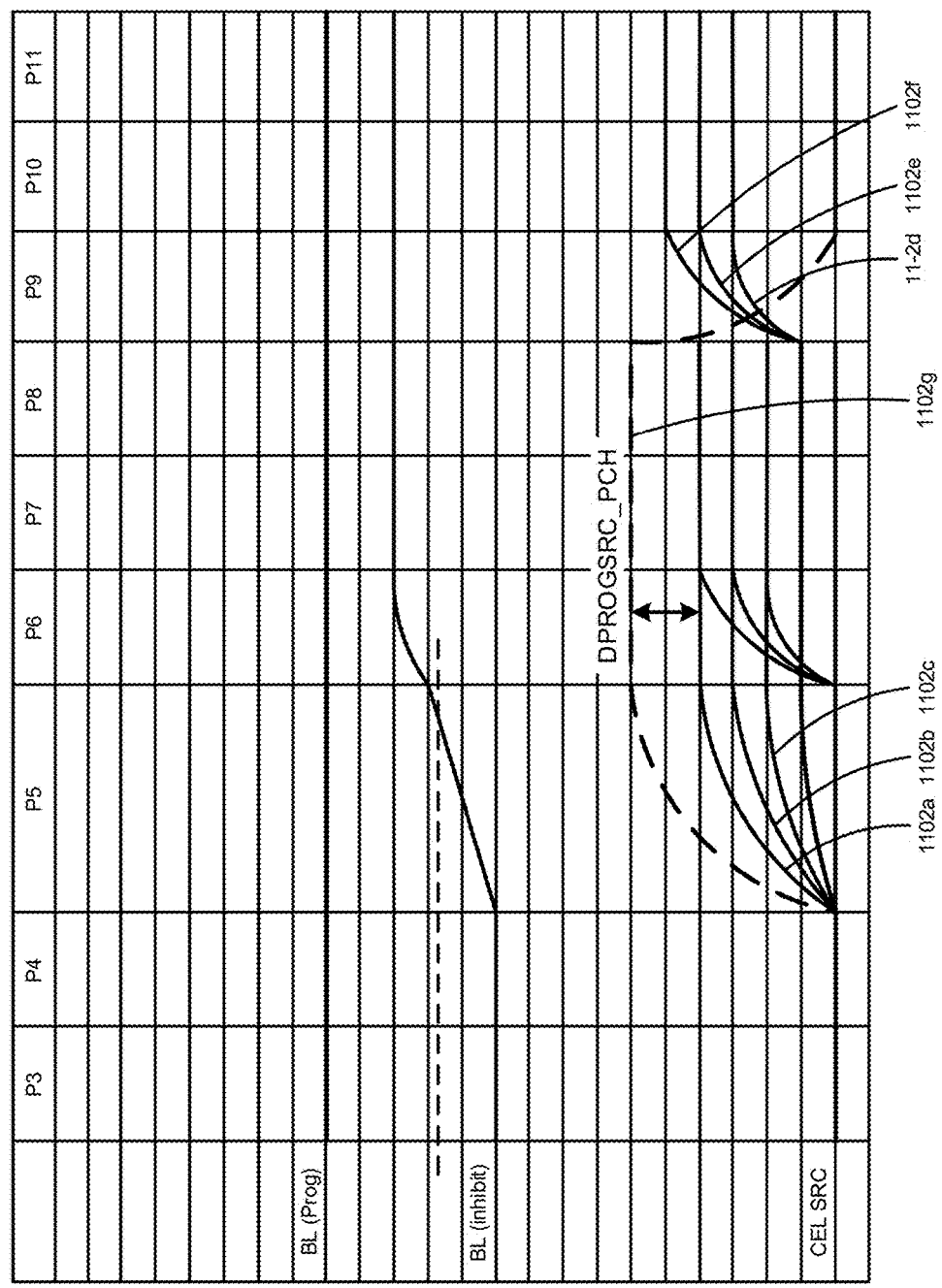
FIG. 11 illustrates an alternate timing diagram showing an additional exemplary pre-charge scheme, in accordance with some described embodiments.

FIG. 11 illustrates an alternate timing diagram 1100 showing an additional exemplary pre-charge scheme, in accordance with some described embodiments. As shown, CELSRC pre-charge occurs from clock times P5 to P9. Also, the PROGSRC is the CELSRC. There are several different levels of PROGSRC, as represented by the curves 1102a, 1102b, and 1102c. Additionally, a bit line pre-charge occurs relatively from clock times P5 to P6 and from clock times P6 to P7. Also, there are several curves 1102*d*, 1102*e*, and 1102*f*, each represents different levels of PROGSRC_PGM.

Additionally, the timing diagram 1200 shows a curve 1202*g*, which shows an offset parameter DPROGSRC_PCH of PROGSRC_PCH. By adding DPROGSRC_PCH to PROGSRC_PCH, a new PROGSRC_PCH pre-charge voltage can be used for a particular WL or WL zone (of multiple WL's). As will be discussed below, additional PROGSRC_PCH pre-charge voltages can be generated for different WL zones. As a result, the original PROGSRC_PCH can be decoupled into different parameters for different WL zones. In some embodiments, the PROGSRC_PCH is greater than PROGSRC_PGM. For example, the PROGSRC_PCH can be set to 1.8 V while the PROGSRC_PGM can be set to 1.1 V. Moreover, the PROGSRC_PCH can be set to the power supply voltage ("Vdd"). By adding DPROGSRC_PCH, an upper tail of the erased data state can be reduced, and the Vt distribution window degradation can be mitigated. Further, when PROGSRC_PCH is decoupled, a memory device can use a parameter PROGSRC WL_BORDER to determine which of the PROGSRC_PCH pre-charge voltages to employ.

Figure 12:
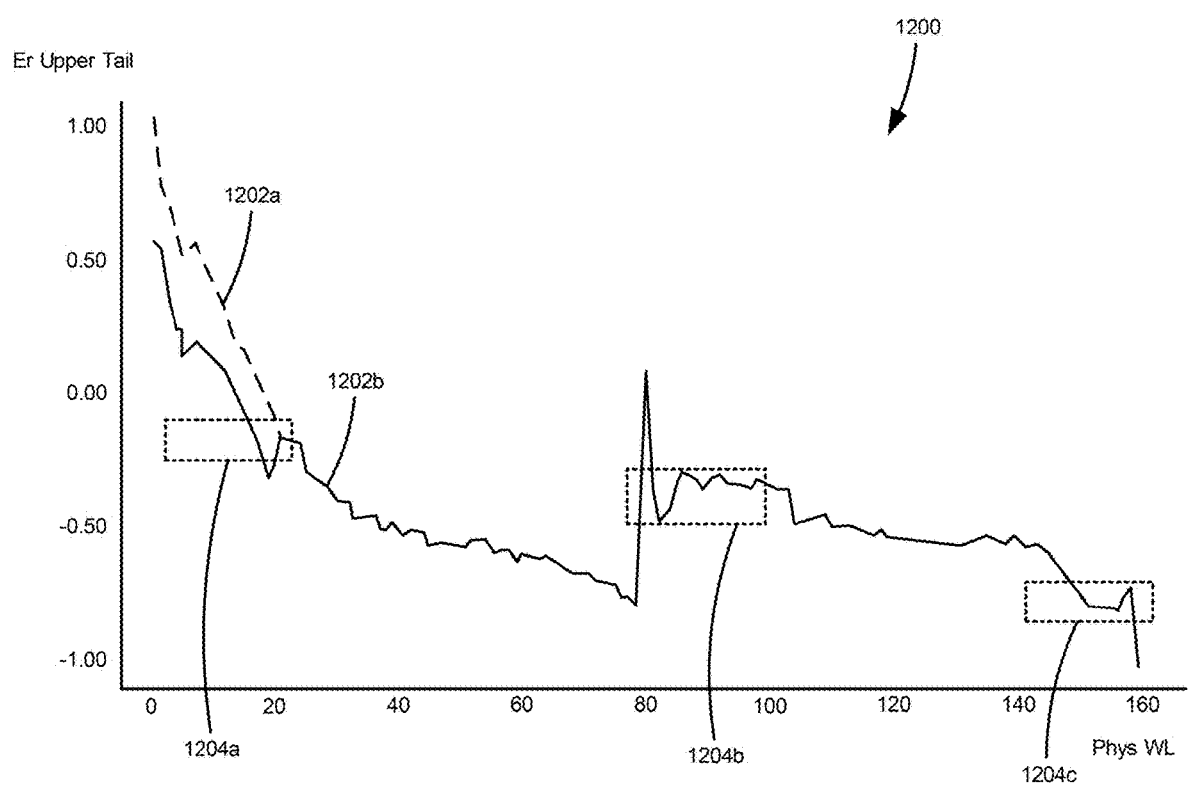
FIG. 12 illustrates a graph showing erase ("Er") upper tail vs physical word lines, in accordance with some described embodiments.

FIG. 12 illustrates a graph 1200 showing erase ("Er") upper tail vs physical word lines, in accordance with some described embodiments. As shown, the graph 1200 includes a curve 1202*a* (dotted line) and a curve 1202*b*. The curve 1202*a* represents a default curve when a single PROGSRC_PCH is used, while the curve 1202*b* represents one or more of the present embodiments in which the PROGSRC_PCH is decoupled. Also, several WL zones 1204*a*, 1204*b*, and 1204*c* (dotted rectangles are shown).

It can be observed that the WL zone 1304*a* represents a PROGSRC_PCH combined with DPROGSRC_PCH. At the WL zone 1204*a* (WL0-WL20), the Er upper tail can be reduced by several hundred millivolts. The reduced Er upper tail can mitigate Vt distribution window degradation, and improve Tprog and ave Icc. Although WL zone 1204*a* includes physical WL 20 and other physical WL's less than 20, the WL zone 1204*a* can include additional physical WL's. Additionally, WL zones 1204*b* and 1204*c*—different, non-overlapping WL zones—may include their own respective DPROGSRC_PCH' and DPROGSRC_PCH", respectively, with DPROGSRC_PCH' and DPROGSRC_PCH" each representing a different parameter (e.g., pre-charge voltage) value.

Figure 13:
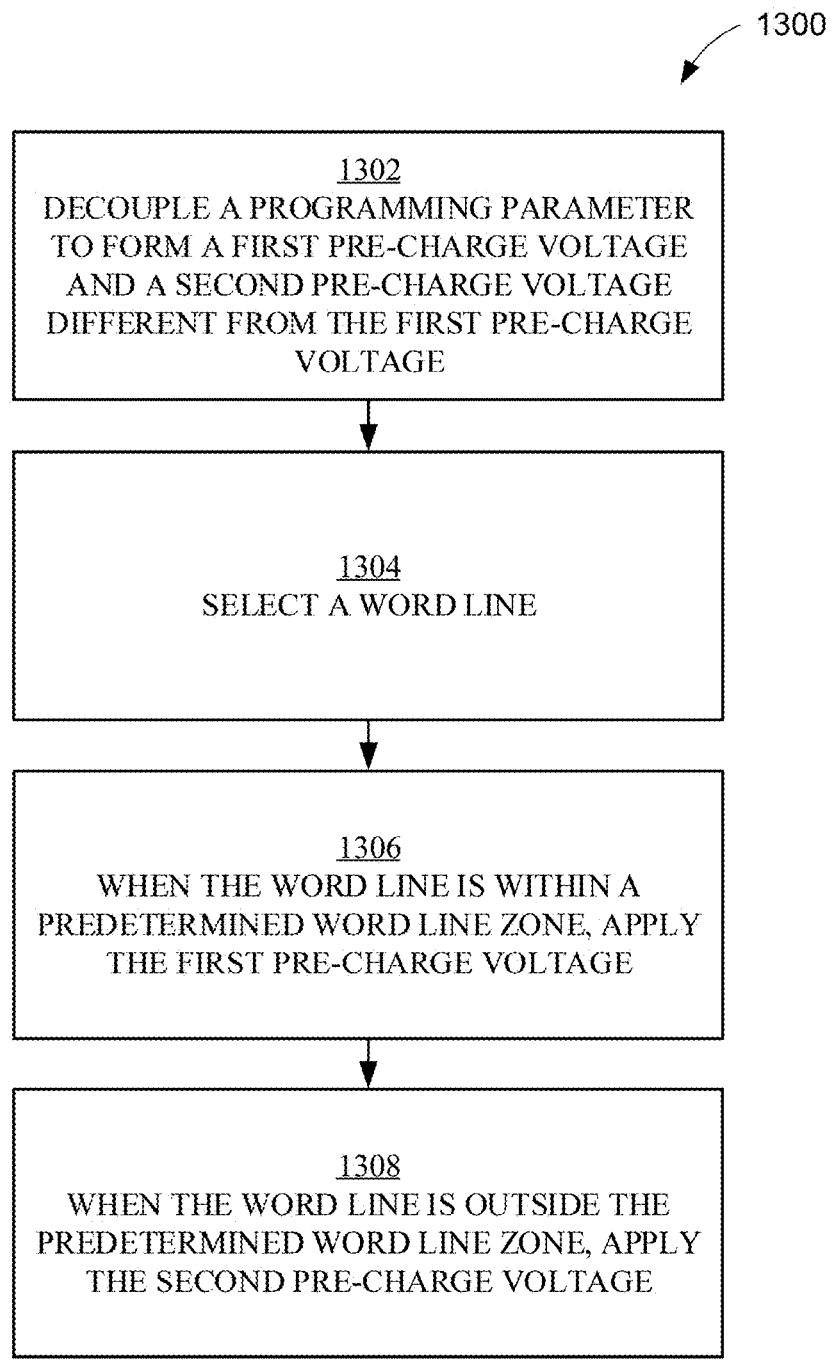
FIG. 13 illustrates a flowchart showing a method for programming a memory system, in accordance with some described embodiments.

FIG. 13 illustrates a flowchart 1300 showing a method for programming a memory system, in accordance with some described embodiments. The flowchart 1300 may be performed by a memory device described herein.

At step 1302, a programming parameter is decoupled to form a first pre-charge voltage and a second pre-charge voltage different from the first pre-charge voltage. For example, PROGSRC_PCH can be decoupled to form and additional PROGSRC_PCH with an additional DPROGSRC_PCH added thereto. Thus, the pre-charge programming parameter may include both a first pre-charge voltage corresponding to PROGSRC_PCH' (equal to PROGSRC_PCH plus DPROGSRC_PCH) and a second pre-charge voltage corresponding to PROGSRC_PCH (original). Accordingly, the first pre-charge voltage may be greater than the second pre-charge voltage. In some embodiments, the programming parameter is decoupled into two or more different PROGSRC_PCH pre-charge parameters, with each PROGSRC_PCH having a unique DPROGSRC_PCH added thereto. Further, each of the PROGSRC_PCH pre-charge voltages can be assigned to a WL zone.

At step 1304, a word line is selected. Based on the selected WL, a determination can be made whether the WL is within a predetermined WL zone.

At step 1306, when the word line is within a predetermined word line zone, the first pre-charge voltage is applied. For example, when the selected WL is a physical WL 20 (a relatively low WL on a BiCS6 NAND flash memory), the first pre-charge voltage (relatively higher) is applied.

At step 1308, when the word line is outside the predetermined word line zone, applying the second pre-charge voltage is applied. For example, when the selected WL is a physical WL not within the predetermined WL zone, the second pre-charge voltage (relatively lower) is applied. Accordingly, when the selected WL is not within the predetermined WL zone, the original PROGSRC_PCH can be used.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for programming a memory system, the method comprising:
   defining a programming parameter to form a first pre-charge voltage for word lines in a predetermined word line zone and to form a second pre-charge voltage different from the first pre-charge voltage for word lines outside of the predetermined word line zone;
   selecting a word line;
   in response to the word line being within the predetermined word line zone, applying the first pre-charge voltage;
   in response to the word line being outside the predetermined word line zone, applying the second pre-charge voltage,
   wherein the first pre-charge voltage comprises a first cell source voltage, and the second pre-charge voltage comprises a second cell source voltage that is less than the first cell source voltage; and
   applying a programming voltage to the word line, wherein the programming voltage is less than the first cell source voltage.

2. A method for programming a memory system, the method comprising:
   defining a programming parameter to form a first pre-charge voltage for word lines in a predetermined word line zone and to form a second pre-charge voltage different from the first pre-charge voltage for word lines outside of the predetermined word line zone;
   selecting a word line;
   in response to the word line being within the predetermined word line zone, applying the first pre-charge voltage; and
   in response to the word line being outside the predetermined word line zone, applying the second pre-charge voltage, wherein the predetermined word line zone is a first predetermined word line zone, and further comprising the steps of:
   defining the programming parameter to form a third pre-charge voltage different from the first pre-charge voltage and the second pre-charge voltage for word lines within a second predetermined word line zone; and in response to word line being within the second predetermined word line zone, applying the third pre-charge voltage.

3. The method according to claim 2, wherein the first predetermined word line zone comprises physical word lines WL0-WL20.

4. The method according to claim 3, wherein the second predetermined word line zone comprises at least one physical word line that is greater than the physical word line WL20.

5. The method according to claim 1, further comprising applying a bit line pre-charge voltage while applying the first pre-charge voltage.

6. A memory system, comprising:
a memory device; and
a controller operatively coupled to the memory device, the controller configured to:
define a programming parameter to form a first pre-charge voltage for word lines within a predetermined word line zone and to form a second pre-charge voltage different from the first pre-charge voltage for word lines outside the predetermined word line zone;
select a word line;
in response to the word line being within the predetermined word line zone, apply the first pre-charge voltage;
in response to the word line being outside the predetermined word line zone, apply the second pre-charge voltage,
wherein the first pre-charge voltage comprises a first cell source voltage, and the second pre-charge voltage comprises a second cell source voltage that is less than the first cell source voltage; and
apply a programming voltage to the word line, wherein the programming voltage is less than the first cell source voltage.

7. The memory system according to claim 6, wherein the predetermined word line zone is a first predetermined word line zone and wherein the controller is further configured to:
define the programming parameter to form a third pre-charge voltage different from the first pre-charge voltage and the second pre-charge voltage for word lines within a second predetermined word line zone; and
in response to the word line being within the second predetermined word line zone, apply the third pre-charge voltage.

8. The memory system according to claim 7, wherein the first predetermined word line zone comprises physical word lines WL0-WL20.

9. The memory system according to claim 8, wherein the second predetermined word line zone comprises at least one physical word line greater than the physical word line WL20.

10. The memory system according to claim 6, wherein the controller is further configured to apply a bit line pre-charge voltage while applying the first pre-charge voltage.

11. A non-transitory computer readable storage medium configured to store instructions that, when executed by a processor included a controller of a memory system, cause the memory system to carry out steps to:
define a programming parameter to form a first pre-charge voltage for word lines within a predetermined word line zone and to form a second pre-charge voltage different from the first pre-charge voltage for word lines outside the predetermined word line zone;
select a word line;
in response to the word line being within the predetermined word line zone, apply the first pre-charge voltage;
in response to the word line being outside the predetermined word line zone, apply the second pre-charge voltage,
wherein the first pre-charge voltage comprises a first cell source voltage, and the second pre-charge voltage comprises a second cell source voltage that is less than the first cell source voltage; and
apply a programming voltage to the word line, whereing the programming voltage is less than the first cell source voltage.

12. The non-transitory computer readable storage medium according to claim 11, wherein the predetermined word line zone is a first predetermined word line zone and wherein the controller is further configured to:
define the programming parameter to form a third pre-charge voltage different from the first pre-charge voltage and the second pre-charge voltage for a second predetermined word line zone; and
in response to the word line being within the second predetermined word line zone, apply the third pre-charge voltage.

13. The non-transitory computer readable storage medium according to claim 12, wherein the first predetermined word line zone comprises physical word lines WL0-WL20, and the second predetermined word line zone comprises a physical word line greater than the physical word line WL20.

14. The non-transitory computer readable storage medium according to claim 11, wherein the controller is further configured to apply a bit line pre-charge voltage while applying the first pre-charge voltage.

* * * * *